United States Patent
Hsu et al.

(10) Patent No.: US 9,251,984 B2
(45) Date of Patent: Feb. 2, 2016

(54) HYBRID RADIO FREQUENCY COMPONENT

(71) Applicants: Hao-Han Hsu, Portland, OR (US); Rashed Mahameed, Beaverton, OR (US); Mohamed A. Abdelmoneum, Portland, OR (US); Dong-Ho Han, Beaverton, OR (US)

(72) Inventors: Hao-Han Hsu, Portland, OR (US); Rashed Mahameed, Beaverton, OR (US); Mohamed A. Abdelmoneum, Portland, OR (US); Dong-Ho Han, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 385 days.

(21) Appl. No.: 13/728,399

(22) Filed: Dec. 27, 2012

(65) Prior Publication Data

US 2014/0184028 A1 Jul. 3, 2014

(51) Int. Cl.

| | | |
|---|---|---|
| *H01L 41/09* | (2006.01) | |
| *H02N 1/00* | (2006.01) | |
| *H01H 59/00* | (2006.01) | |
| *B81B 3/00* | (2006.01) | |
| *H01H 1/00* | (2006.01) | |
| *H01H 57/00* | (2006.01) | |

(52) U.S. Cl.
CPC .......... *H01H 59/0009* (2013.01); *B81B 3/0056* (2013.01); *B81B 2201/014* (2013.01); *B81B 2203/0118* (2013.01); *H01H 2001/0084* (2013.01); *H01H 2057/006* (2013.01); *H01L 41/094* (2013.01); *Y10T 29/42* (2015.01)

(58) Field of Classification Search
CPC ...................................................... H04R 17/00
USPC .................. 310/309, 311, 328, 330, 348, 349
See application file for complete search history.

(56) References Cited

U.S. PATENT DOCUMENTS

| | | | | |
|---|---|---|---|---|
| 5,666,258 | A * | 9/1997 | Gevatter et al. | 361/207 |
| 6,479,920 | B1 * | 11/2002 | Lal et al. | 310/309 |
| 7,471,176 | B2 * | 12/2008 | Bunyan et al. | 335/78 |
| 7,529,154 | B2 * | 5/2009 | Cole et al. | 367/162 |
| 7,633,213 | B2 * | 12/2009 | Takayama et al. | 310/331 |
| 7,728,703 | B2 | 6/2010 | Kim et al. | |
| 7,772,745 | B2 * | 8/2010 | Kawakubo et al. | 310/330 |
| 2002/0050881 | A1 * | 5/2002 | Hyman et al. | 335/78 |
| 2004/0075366 | A1 * | 4/2004 | Mehta | 310/336 |
| 2004/0192362 | A1 * | 9/2004 | Vicari | 455/507 |
| 2006/0208612 | A1 | 9/2006 | Takayama et al. | |

(Continued)

FOREIGN PATENT DOCUMENTS

| | | |
|---|---|---|
| CN | 1971797 A | 5/2007 |
| CN | 101276707 A | 10/2008 |

(Continued)

OTHER PUBLICATIONS

International Search Report and Written Opinion Received for PCT Patent Application No. PCT/US2013/047796, mailed on Oct. 17, 2013, 15 Pages.

(Continued)

*Primary Examiner* — Thomas Dougherty
(74) *Attorney, Agent, or Firm* — Jordan IP Law, LLC

(57) ABSTRACT

Methods and systems may provide for a hybrid RF MEMS component design including an electrostatic actuation and a piezoelectric actuation. In one example, the method may include applying a first voltage to generate a first piezoelectric force to reduce a first gap between a cantilever and an actuation electrode, and applying a second voltage to generate an electrostatic force to create contact between the cantilever and a transmission electrode.

9 Claims, 4 Drawing Sheets

(56) References Cited

U.S. PATENT DOCUMENTS

| | | |
|---|---|---|
| 2006/0227489 A1 | 10/2006 | Bunyan et al. |
| 2007/0024403 A1* | 2/2007 | Kwon et al. ................ 335/78 |
| 2007/0115081 A1 | 5/2007 | Kim et al. |
| 2009/0026880 A1 | 1/2009 | Liu |
| 2009/0165843 A1 | 7/2009 | Horioka et al. |
| 2011/0094861 A1* | 4/2011 | Feng et al. ................ 200/181 |
| 2013/0235001 A1* | 9/2013 | Yun et al. .................. 345/204 |

FOREIGN PATENT DOCUMENTS

| | | |
|---|---|---|
| CN | 10150185 A | 8/2009 |
| JP | 2005-302711 A | 10/2005 |
| JP | 2007-535863 A | 12/2007 |
| JP | 2008-238330 A | 10/2008 |
| JP | 2009-238547 A | 10/2009 |
| JP | 2011-176038 A | 9/2011 |
| WO | 2005/112188 A1 | 11/2005 |

OTHER PUBLICATIONS

Office Action for Korean Patent Application No. 2014-7017758, dated Jun. 11, 2015, 19 pages. Includes 10 pages of English translation.

Office Action for Chinese Patent Application No. 201380004526.0, dated Apr. 28, 2015, 29 pages. Includes 19 pages of English translation.

Office Action received for Japanese Patent Application No. 2014-554997, mailed Sep. 15, 2015, 25 pages including 13 pages of English translation.

* cited by examiner

HYBRID RADIO FREQUENCY COMPONENT

BACKGROUND

Radio Frequency (RF) microelectromechanical (MEMS) components may be favored for use in consumer electronics devices for displaying high signal isolation, low insertions losses, and low power consumption.

In some cases, an RF MEMS component may utilize electrostatic force for actuation. However, use of electrostatic force may require higher actuation voltages (e.g., 40-150 volts), rendering the RF MEMS component inoperable with other device components.

Alternatively, an RF MEMS component may utilize a piezoelectric actuation mechanism for actuation. However, although the piezoelectric actuation mechanism may require lower actuation voltages (<10 volts), it may also render the RF MEMS component incompatible with complementary metal-oxide-semiconductor (CMOS) integrated circuits (IC), and may lead to higher insertion losses.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may provide for a hybrid RF MEMS component including an electrostatic actuation component and a piezoelectric actuation component. The hybrid RF MEMS component may be configured to minimize insertion losses and operate with lower actuation voltages. The hybrid RF MEMS component may be incorporated into various electronic devices (e.g., a notebook, a tablet device, or a mobile phone), and may be configured to facilitate various communication protocols (e.g., 3G, GSM, Wi-Fi, 4G LTE, etc.), depending upon the circumstances.

Figure 1:
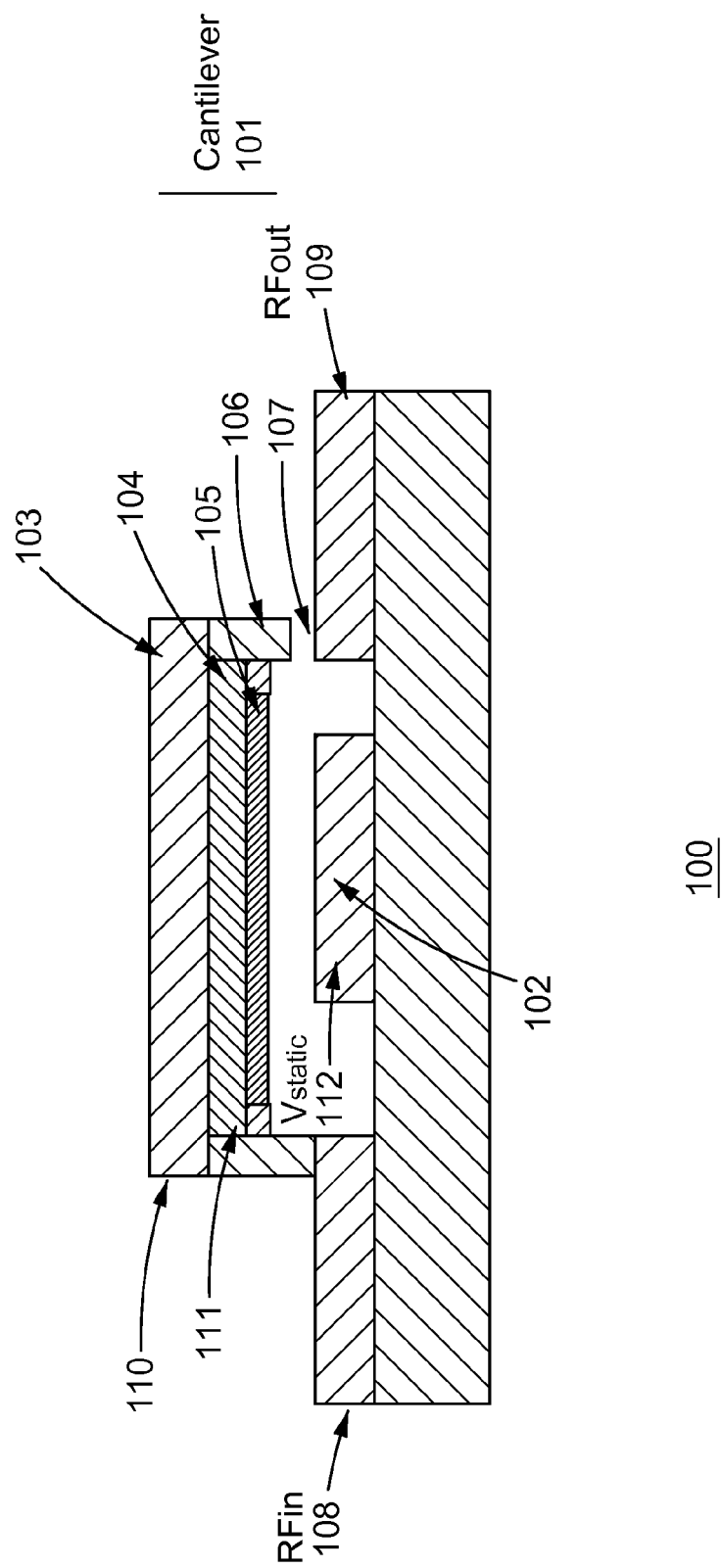
FIG. 1 is a block diagram of an example of an RF MEMS component according to an embodiment.

Turning now to FIG. 1, a block diagram of an example of an RF MEMS component 100 is shown. In this example, the RF MEMS component 100 may be an RF switch incorporated into a mobile phone. The RF MEMS component 100 may include a cantilever 101 and an actuation electrode 102. As will be discussed in greater detail, the cantilever 101 and the actuation electrode 102 may be configured to propagate an RF signal from an $RF_{in}$ electrode layer 108 to an $RF_{out}$ electrode layer 109. The cantilever 101 may include a top metal layer 103, a piezoelectric layer 104, a bottom metal layer 105, and a protrusion 106.

The top metal layer 103 may be a metal layer configured to propagate an RF signal. The piezoelectric layer 104 may be a layer composed of piezoelectric material, and may be attached to and located below the top metal layer 103. Of particular note is that the piezoelectric layer 104 may be composed of aluminum nitride (AlN). AlN may currently be the only piezoelectric material that is compatible with CMOS processes.

The bottom metal layer 105 may be a metal layer attached to and located below the piezoelectric layer 104. In this example, then bottom metal layer 105 may be relatively thinner than the top metal layer 103. In particular, the top metal layer 103 may deposited to be 1.0-10.0 micrometers in thickness, while the bottom metal layer 105 may be deposited to be 0.1-0.5 micrometers in thickness.

The protrusion 106 may be a structure extending from the cantilever 101 toward the $RF_{out}$ electrode layer 109. So, in this example, if the RF MEMS component 100 may be in an off-state (i.e., no actuation voltage may be applied), a gap 107 may separate the protrusion 106 and the $RF_{out}$ electrode layer 110. The gap 107 may be used to prevent RF signal transmission from the cantilever 101 to the $RF_{out}$ electrode layer 109.

Now, if a first voltage may be applied between $V_{piezo}$ 110 and dc GND 111 to initiate the RF MEMS component 100 to an on-state, a piezoelectric actuation mechanism (utilizing the piezoelectric layer 104) may be activated to implement a piezoelectric force. As will be discussed in greater detail, this piezoelectric force may reduce the distance between the cantilever 101 and the actuation electrode 102 by extending the protrusion 106 to reduce the gap 107. By reducing the distance between the cantilever 101 and the actuation electrode 102, an electrostatic actuation voltage $V_{static}$ that is relatively lower may be used to close the gap 107, and the insertion losses of the RF MEMS component 100 may be minimized.

Furthermore, if a second voltage may be may be applied between $V_{static}$ 112 and dc GND 111 as well, an electrostatic actuation mechanism (utilizing the cantilever 101) may be activated to implement an electrostatic force. As will be discussed in greater detail, this electrostatic force may cause the cantilever 101 to bend downward toward the actuation electrode 102. Upon bending the cantilever 101 toward the actuation electrode 102, application of a relatively lower $V_{static}$ may generate a high contact force, and may minimize contact resistance and insertion losses of the RF MEMS component 100. In addition, in some cases, upon the application of the piezoelectric force and the electrostatic force (i.e., the RF MEMS component 100 may be in an on-state), the protrusion 106 may make contact with the $RF_{out}$ electrode layer 109 to allow a RF signal to propagate.

Figure 2:
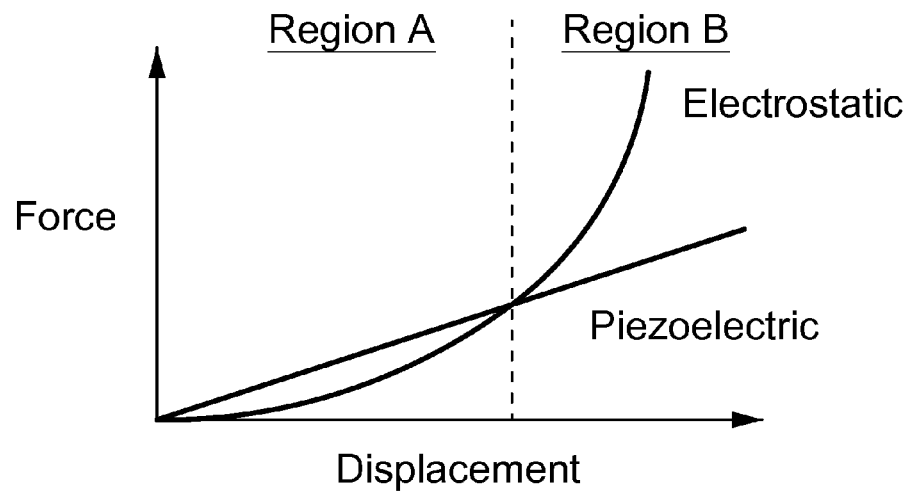
FIG. 2 is a diagram illustrating an example of a relationship between force and deflection/displacement as relating to piezoelectric force and electrostatic force.

Turning now to FIG. 2, a diagram illustrating a relationship between force and displacement/deflection as relating to piezoelectric force and electrostatic force is illustrated. Displacement/deflection by piezoelectric force may be linearly proportional to an applied voltage. As such, a voltage required for a large displacement/deflection may be lower for piezoelectric actuation than for electrostatic actuation.

For example, take the case of RF MEMS component 100 (FIG. 1) including the gap 107 (FIG. 1). So, if the gap 107 may be relatively large, electrostatic force may be inefficient as a high $V_{static}$ may be required to close the gap 107. In such a case, piezoelectric force may be utilized to efficiently (i.e., with lower voltage requirements) decrease the gap 107, and to minimize insertion losses for the RF MEMS component 100 while utilizing a relatively lower $V_{static}$.

On the other hand, electrostatic force may be inversely-squared proportional to a length of a gap (e.g., a gap between a bottom metal layer and an actuation electrode). As such, electrostatic force may be larger than a piezoelectric force in the case of smaller gaps.

So, again, in the example of the RF MEMS component 100, an electrostatic force may be used to create a force sufficient to generate contact between the protrusion 106 and the RFout 109. As a result, contact resistance and insertion losses for the RF MEMS component may be minimized.

Figure 3:
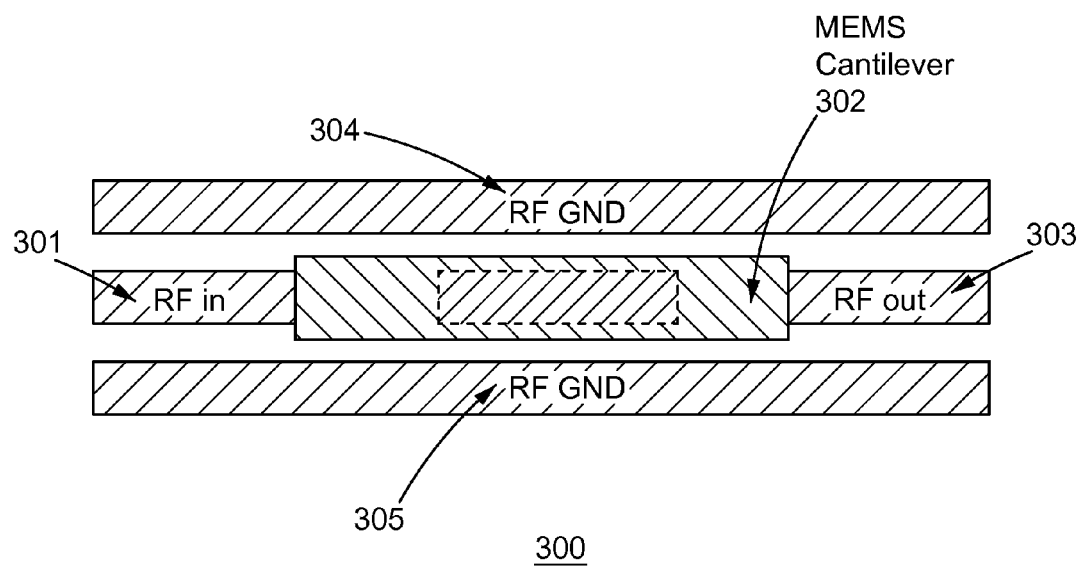
FIG. 3 is a block diagram of an example of a portion of an electronic device including an RF MEMS component according to an embodiment.

Turning now to FIG. 3, a block diagram of a portion of an RF MEMS device 300 is shown. In this example, the RF MEMS device 300 may include $RF_{in}$ electrode layer 301, a MEMS cantilever 302, an $RF_{out}$ electrode layer 303, a first (top) ground layer RF GND 304, and a second (bottom) ground layer RF GND 305. In this example, the MEMS cantilever 302 may be similar to the cantilever 101 (FIG. 1), and may be used to propagate an RF signal from the $RF_{in}$ electrode layer 301 to the $RF_{out}$ electrode layer 303.

Figure 4A:
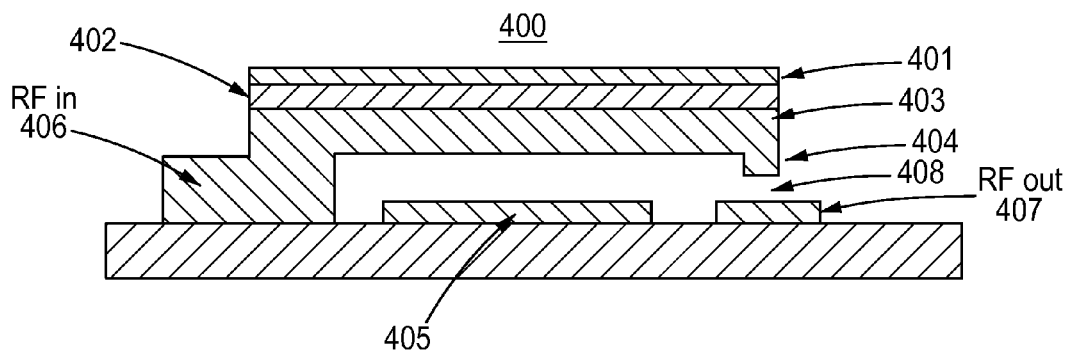
FIGS. 4A-4C are block diagrams of an example of an RF MEMS component according to an embodiment.
Figure 4B:
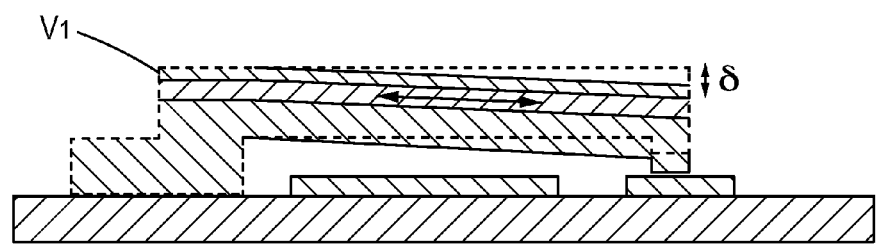
Figure 4C:
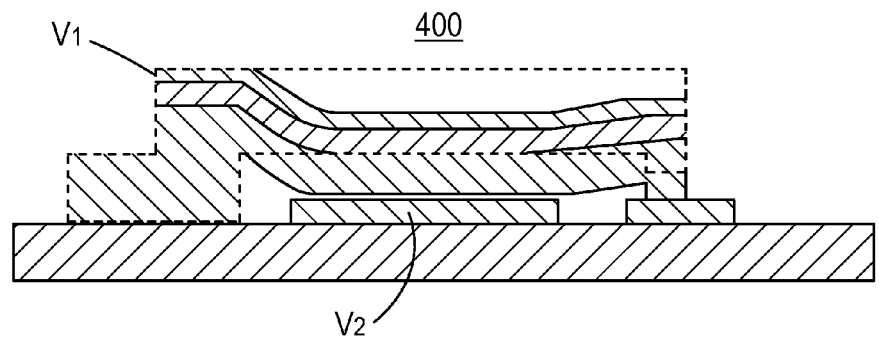

Turning now to FIGS. 4A-4C, block diagrams of an example of an RF MEMS component 400, similar to the RF MEMS component 100 (FIG. 1), are shown. In this example, the RF MEMS component 400 may be an RF switch incorporated into a notebook computer.

The RF MEMS component 400 may include a top electrode layer 401, a piezoelectric layer 402, a bottom electrode layer 403, and a protrusion 404. In addition, the RF MEMS component 400 may include an electrostatic actuation electrode 405, an $RF_{in}$ electrode layer 406, and an $RF_{out}$ electrode layer 407.

The top electrode layer 401 may be a first metal layer, similar to the top metal layer 103 (FIG. 1), and the bottom electrode layer 403 may be a second metal layer, similar to the bottom metal layer 105 (FIG. 1). In this example, the bottom electrode layer may be thick, and the top electrode layer 401 may be relatively thinner than the bottom electrode layer 403. The piezoelectric layer 402, similar to the piezoelectric layer 104 (FIG. 1), may be made composed of AlN, which is particularly suitable for CMOS processes.

In particular, FIG. 4A illustrates a block diagram of the RF MEMS component 400 in an off-state (i.e., no actuation voltage may be applied). When the RF MEMS component 400 may be in an off-state, the protrusion 404 may extend toward but not make contact with the $RF_{out}$ electrode layer 407, as evidenced by gap 408. As such, RF signal transmission to the $RF_{out}$ electrode layer 407 may be prevented. In addition, when the RF MEMS component 400 may be in an off-state, the bottom electrode layer 403 may not make contact with the electrostatic actuation electrode 405.

FIG. 4B illustrates a block diagram of the RF MEMS component 400 when a first actuation mechanism may be activated. In this example, the first actuation mechanism may be a piezoelectric actuation mechanism.

So, in this example, a first voltage $V_1$ of a first polarity may be applied between the top electrode layer 401 and the piezoelectric layer 402. The application may generate an electric field, and may cause the piezoelectric layer 402 to elongate laterally, while maintaining the length of the top electrode layer 401 and the bottom electrode layer 403. This deformation of the piezoelectric layer 402 relative to the top electrode layer 401 and the bottom electrode layer 403 may create a bending moment.

This bending moment may cause portions of the RF MEMS component 400, such as the top electrode layer 401, the piezoelectric layer 402, and the bottom electrode layer 403, to bend closer towards the electrostatic actuation electrode 405. For example, the bending moment may cause the protrusion 404 to bend downward by a distance δ toward the $RF_{out}$ electrode layer 407, reducing the gap 408, and the gap between the bottom electrode layer 403 and the electrostatic actuation electrode 405.

Now, in some cases, stiction forces may develop between components of the RF MEMS component 400. For example, stiction may develop between the protrusion 404 and the $RF_{out}$ electrode layer 407. In such a case, a voltage of opposing polarity to $V_1$ may be applied to generate an electric field, causing the piezoelectric layer 402 to shrink, while maintaining the length of the top electrode layer 401 and the bottom electrode layer 403. This may create a reverse bending moment, and may cause the protrusion 404 to bend upward and away from the $RF_{out}$ electrode layer 407, and to increase the gap 408.

FIG. 4C illustrates the RF MEMS component 400 when a second actuation mechanism may be activated. In this example, the second actuation mechanism may be an electrostatic actuation mechanism. In particular, in this example, a second voltage V2 may be applied between the bottom electrode layer 403 and the electrostatic actuation electrode 405 causing contact between the bottom electrode layer 403 of the cantilever and the electrostatic actuation electrode 405 as seen in FIG. 4C.

Accordingly, an implementation of the piezoelectric actuation voltage $V_1$ may reduce a distance between a cantilever, such as the cantilever 101 (FIG. 1), and an electrostatic actuation electrode, such as the electrostatic actuation electrode 405 (FIG. 4). This reduction of distance may allow a lower electrostatic actuation voltage $V_2$ to be used to generate a high contact force with a transmission line, and to minimize contact resistance and insertion losses of the RF MEMS component 400.

Figure 5:
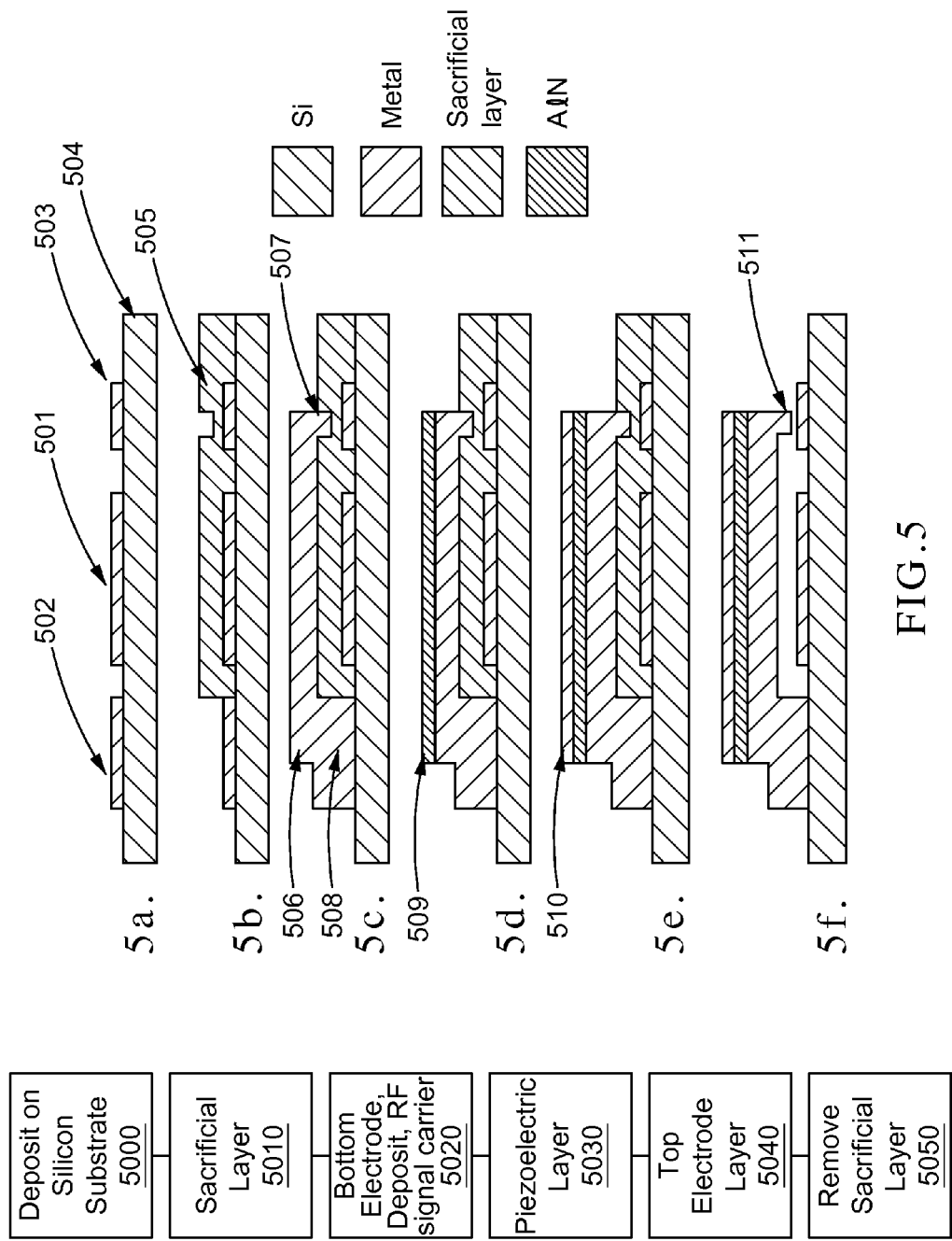
FIG. 5 is a flowchart and an illustration of an example of a fabrication process of an RF MEMS component according to an embodiment.

Turning now to FIG. 5, a flowchart and an illustration of an example of a fabrication process of an RF MEMS component, such as the RF MEMS component 400 (FIG. 4), according to an embodiment is shown.

The method might be implemented as a set of logic instructions stored in a machine- or computer-readable storage medium such as, for example, random access memory (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as application specific integrated circuit (ASIC), complementary metal oxide semiconductor (CMOS) or transistor-transistor logic (TTL) technology, in semiconductor fabrication equipment, or any combination thereof. For example, computer program code to carry out operations shown in the method may be written in any combination of one or more programming languages, including an object oriented programming language such as, for example, Java, Smalltalk, C++ or the like and conventional procedural programming languages, such as the "C" programming language or similar programming languages.

At processing block 5000, an actuation electrode 501, similar to the actuation electrode 405 (FIG. 4), an $RF_{in}$ electrode layer 502, similar to the $RF_{in}$ electrode layer 406 (FIG. 4), and an $RF_{out}$ electrode layer 503, similar to the $RF_{out}$ electrode layer 407 (FIG. 4) may be deposited and patterned on top of a substrate 504 (e.g., a silicon substrate). One approach to the patterning of the actuation electrode 501, the $RF_{in}$ electrode layer 502, and the $RF_{out}$ electrode layer 503 is illustrated in stage 5a. of FIG. 5.

At processing block 5010, a sacrificial layer 505 may be deposited and patterned on top of the actuation electrode 501 and the $RF_{out}$ layer 503. In addition, the sacrificial layer 505 may be etched back at a particular location to accommodate a protrusion. One approach to the depositing, patterning, and etching back of sacrificial layer 505 is illustrated in stage 5b. of FIG. 5.

At processing block 5020, a bottom electrode layer 506, similar to the bottom electrode layer 403 (FIG. 4), a protrusion 507, similar to the protrusion 404 (FIG. 4), and an RF signal carrier layer 508 may be deposited and patterned on top of the sacrificial layer 505. One approach to the depositing and patterning of the bottom electrode layer 506, the protrusion 507, and the RF signal carrier 508 is illustrated in stage 5c. of FIG. 5.

At processing block 5030, a piezoelectric layer 509, similar to the piezoelectric layer 402 (FIG. 4), may be deposited and patterned on top of the bottom electrode layer 506. In this example, the piezoelectric layer 509 may be composed of AlN. One approach to depositing and patterning of the piezoelectric layer 509 is illustrated in stage 5d. of FIG. 5.

At processing block 5040, a top electrode layer 510, similar to the top electrode layer 401 (FIG. 4), may be deposited and patterned on top of the piezoelectric layer 509. In this example, the top electrode layer 510 may be relatively thinner than the bottom electrode layer 506. One approach to the depositing and patterning of the top electrode layer 510 is illustrated in stage 5e. of FIG. 5.

At processing block 5050, the sacrificial layer 505 may be removed to create a gap 511, similar to the gap 408 (FIG. 4), between the protrusion 507 and the $RF_{out}$ layer 503. One approach to the removal of the sacrificial layer 505 is illustrated in stage 5f. of FIG. 5.

Embodiments may therefore provide for a system comprising a processing component, a memory component coupled to the processing component, and a wireless radio component to propagate a radio frequency (RF) signal coupled to the processing component. The wireless radio component may include an RF switch, and the RF switch may include an actuation electrode and a cantilever. The cantilever may include a top electrode layer, and a piezoelectric layer located below and attached to the top electrode layer, wherein the piezoelectric layer includes aluminum nitride (AlN). The cantilever may also include a bottom electrode layer located below and attached to the piezoelectric layer, wherein a protrusion extends from the bottom electrode layer to create a gap between the protrusion and a transmission electrode.

Another embodiment may provide for a method comprising applying a first voltage to generate a first piezoelectric force to reduce a first gap between a cantilever and an actuation electrode, and applying a second voltage to generate an electrostatic force to close a second gap between the cantilever and a transmission electrode.

Still another embodiment may provide for an apparatus comprising an actuation electrode and a cantilever. The cantilever may include a top electrode layer, a piezoelectric layer located below and attached to the top electrode layer, and a bottom electrode layer located below and attached to the piezoelectric layer, wherein a protrusion extends from the bottom electrode layer to create a gap between the protrusion and a transmission electrode.

Yet another embodiment may provide for a method comprising patterning a bottom electrode layer, wherein the bottom electrode layer includes a protrusion, patterning a piezoelectric layer on top of the bottom layer, and patterning a top electrode layer on top of the piezoelectric layer.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

Some embodiments may be implemented, for example, using a machine or tangible computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

We claim:

1. A system comprising:
   a processing component;
   a memory component coupled to the processing component; and
   a wireless radio component to propagate a radio frequency (RF) signal coupled to the processing component, wherein the wireless radio component is to include an RF switch, the RF switch having,
   an actuation electrode; and
   a cantilever including,
   a top electrode layer;
   a piezoelectric layer located below and attached to the top electrode layer, wherein the piezoelectric layer includes aluminum nitride (AlN) and wherein the cantilever is deformed via a first piezoelectric force to reduce the gap between the bottom electrode layer and the actuation electrode upon application of a first voltage; and
   a bottom electrode layer located below and attached to the piezoelectric layer, wherein a protrusion extends from the bottom electrode layer to create a gap between the protrusion and a transmission electrode wherein the cantilever is deformed via an electrostatic force to bend the cantilever to contact the actuation electrode upon application of a second voltage between the bottom electrode layer and the actuation electrode.

2. The system of claim 1, wherein the application of the first voltage is to be between the top electrode layer and the piezoelectric layer.

3. The system of claim 1, wherein the cantilever is deformed via a second piezoelectric force to retract the protrusion away from the transmission electrode upon application of a voltage in an opposing polarity to the first voltage.

4. The system of claim 1, wherein the bottom electrode layer is thicker than the top electrode layer.

5. The system of claim 1, wherein the top electrode layer is thicker than the bottom electrode layer.

6. An apparatus comprising:
   an actuation electrode; and
   a cantilever having,
   a top electrode layer;
   a piezoelectric layer located below and attached to the top electrode layer; and
   a bottom electrode layer located below and attached to the piezoelectric layer, wherein a protrusion extends from the bottom electrode layer to create a gap between the protrusion and a transmission electrode and wherein the cantilever is deformed via a first piezoelectric force to reduce the gap between the bottom electrode layer and the actuation electrode upon application of a first voltage and wherein the bottom electrode layer is configured to contact the actuation electrode upon application of a second voltage between the bottom electrode layer and the actuation electrode.

7. The apparatus of claim 6, wherein the cantilever is deformed via a second piezoelectric force to retract the protrusion away from the transmission electrode upon application of a voltage in an opposing polarity to the first voltage.

8. The apparatus of claim 6, wherein the bottom electrode layer is thicker than the top electrode layer.

9. The apparatus of claim 6, wherein the top electrode layer is thicker than the bottom electrode layer.

* * * * *